United States Patent
Schricker et al.

(10) Patent No.: US 7,824,956 B2
(45) Date of Patent: Nov. 2, 2010

(54) MEMORY CELL THAT EMPLOYS A SELECTIVELY GROWN REVERSIBLE RESISTANCE-SWITCHING ELEMENT AND METHODS OF FORMING THE SAME

(75) Inventors: April Schricker, Fremont, CA (US); Brad Herner, San Jose, CA (US); Mark Clark, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 11/772,082

(22) Filed: Jun. 29, 2007

(65) Prior Publication Data

US 2009/0001342 A1 Jan. 1, 2009

(51) Int. Cl.
*H01L 29/02* (2006.01)
(52) U.S. Cl. ............ 438/104; 257/2; 257/E29.002; 365/163
(58) Field of Classification Search ............ 257/1–5, 257/E45.002, E29.002, 43; 438/102–104; 365/163
See application file for complete search history.

(56) References Cited

U.S. PATENT DOCUMENTS

| | | | |
|---|---|---|---|
| 2,655,609 A | 10/1953 | Shockley | |
| 2,971,140 A | 2/1961 | Chappey et al. | |
| 3,796,926 A | 3/1974 | Cole et al. | |
| 4,204,028 A | 5/1980 | Donley | |
| 4,499,557 A | 2/1985 | Holmberg et al. | |
| 4,646,266 A | 2/1987 | Ovshinsky et al. | |
| 4,772,571 A * | 9/1988 | Scovell et al. ............ 438/627 |
| 4,907,054 A | 3/1990 | Berger | |
| 4,940,553 A | 7/1990 | von Benda | |
| 5,037,200 A | 8/1991 | Kodama | |
| 5,166,758 A | 11/1992 | Ovshinsky et al. | |
| 5,273,915 A | 12/1993 | Hwang et al. | |
| 5,311,055 A | 5/1994 | Goodman et al. | |
| 5,774,394 A | 6/1998 | Chen et al. | |
| 5,854,102 A | 12/1998 | Gonzalez et al. | |
| 5,876,788 A | 3/1999 | Bronner et al. | |
| 5,915,167 A | 6/1999 | Leedy | |
| 6,034,882 A | 3/2000 | Johnson et al. | |

(Continued)

FOREIGN PATENT DOCUMENTS

EP 1 308 960 A2 5/2003

(Continued)

OTHER PUBLICATIONS

Ansari et al. (Journal of Physics D: Applied Physics, 20, (1987) pp. 1063-1066).*

(Continued)

*Primary Examiner*—Bradley K Smith
*Assistant Examiner*—Jami M Valentine
(74) *Attorney, Agent, or Firm*—Dugan & Dugan, PC

(57) ABSTRACT

In some aspects, a method of forming a memory cell is provided that includes (1) forming a first conductor above a substrate; (2) forming a reversible resistance-switching element above the first conductor using a selective growth process; (3) forming a diode above the first conductor; and (4) forming a second conductor above the diode and the reversible resistance-switching element. Numerous other aspects are provided.

30 Claims, 8 Drawing Sheets

U.S. PATENT DOCUMENTS

| | | |
|---|---|---|
| RE37,259 E | 7/2001 | Ovshinsky |
| 6,369,431 B1 | 4/2002 | Gonzalez et al. |
| 6,426,891 B1 | 7/2002 | Katori |
| 6,465,370 B1 | 10/2002 | Schrems |
| 6,483,734 B1 | 11/2002 | Sharma et al. |
| 6,534,841 B1 | 3/2003 | Van Brocklin et al. |
| 6,541,792 B1 | 4/2003 | Tran et al. |
| 6,707,698 B2 | 3/2004 | Fricke et al. |
| 6,753,561 B1 | 6/2004 | Rinerson et al. |
| 6,761,985 B2 | 7/2004 | Windisch et al. |
| 6,774,458 B2 | 8/2004 | Fricke et al. |
| 6,778,441 B2 | 8/2004 | Forbes et al. |
| 6,787,401 B2 | 9/2004 | Gonzalez et al. |
| 6,798,685 B2 | 9/2004 | Rinerson et al. |
| 6,815,744 B1 | 11/2004 | Beck et al. |
| 6,831,854 B2 | 12/2004 | Rinerson et al. |
| 6,834,008 B2 | 12/2004 | Rinerson et al. |
| 6,836,421 B2 | 12/2004 | Rinerson et al. |
| 6,850,429 B2 | 2/2005 | Rinerson et al. |
| 6,850,455 B2 | 2/2005 | Rinerson et al. |
| 6,856,536 B2 | 2/2005 | Rinerson et al. |
| 6,859,382 B2 | 2/2005 | Rinerson et al. |
| 6,870,755 B2 | 3/2005 | Rinerson et al. |
| 6,946,719 B2 | 9/2005 | Petti et al. |
| 6,952,030 B2 | 10/2005 | Herner et al. |
| 7,116,573 B2 | 10/2006 | Sakamoto et al. |
| 7,176,064 B2 | 2/2007 | Herner et al. |
| 7,215,564 B2 | 5/2007 | Happ et al. |
| 7,224,013 B2 | 5/2007 | Herner et al. |
| 7,238,607 B2 | 7/2007 | Dunton et al. |
| 7,265,049 B2 | 9/2007 | Herner et al. |
| 7,307,268 B2 | 12/2007 | Scheuerlein |
| 7,391,064 B1 | 6/2008 | Tripsas et al. |
| 7,405,465 B2 | 7/2008 | Herner |
| 7,501,331 B2 | 3/2009 | Herner |
| 2002/0057594 A1 | 5/2002 | Hirai |
| 2003/0013007 A1 | 1/2003 | Kaun |
| 2003/0047727 A1 | 3/2003 | Chiang |
| 2003/0081446 A1 | 5/2003 | Fricke et al. |
| 2003/0209971 A1 | 11/2003 | Kozicki |
| 2004/0002186 A1 | 1/2004 | Vyvoda et al. |
| 2004/0084743 A1 | 5/2004 | Vanbuskirk et al. |
| 2004/0095300 A1 | 5/2004 | So et al. |
| 2004/0159828 A1 | 8/2004 | Rinerson et al. |
| 2004/0159867 A1 | 8/2004 | Kinney et al. |
| 2004/0159869 A1 | 8/2004 | Rinerson et al. |
| 2004/0160798 A1 | 8/2004 | Rinerson et al. |
| 2004/0160804 A1 | 8/2004 | Rinerson et al. |
| 2004/0160805 A1 | 8/2004 | Rinerson et al. |
| 2004/0160806 A1 | 8/2004 | Rinerson et al. |
| 2004/0160807 A1 | 8/2004 | Rinerson et al. |
| 2004/0160808 A1 | 8/2004 | Rinerson et al. |
| 2004/0160812 A1 | 8/2004 | Rinerson et al. |
| 2004/0160817 A1 | 8/2004 | Rinerson et al. |
| 2004/0160818 A1 | 8/2004 | Rinerson et al. |
| 2004/0160819 A1 | 8/2004 | Rinerson et al. |
| 2004/0161888 A1 | 8/2004 | Rinerson et al. |
| 2004/0170040 A1 | 9/2004 | Rinerson et al. |
| 2004/0228172 A1 | 11/2004 | Rinerson et al. |
| 2004/0245557 A1 | 12/2004 | Seo et al. |
| 2005/0045919 A1 | 3/2005 | Kaeriyama et al. |
| 2005/0058009 A1 | 3/2005 | Yang et al. |
| 2005/0167699 A1 | 8/2005 | Sugita |
| 2005/0247921 A1 | 11/2005 | Lee et al. |
| 2005/0286211 A1 | 12/2005 | Pinnow et al. |
| 2006/0006495 A1 | 1/2006 | Herner et al. |
| 2006/0067117 A1 | 3/2006 | Petti |
| 2006/0094236 A1 | 5/2006 | Elkins |
| 2006/0098472 A1 | 5/2006 | Ahn et al. |
| 2006/0128153 A1 | 6/2006 | Dunton et al. |
| 2006/0157679 A1 | 7/2006 | Scheuerlein |
| 2006/0164880 A1 | 7/2006 | Sakamoto et al. |
| 2006/0250836 A1 | 11/2006 | Herner et al. |
| 2006/0250837 A1* | 11/2006 | Herner et al. ............... 365/148 |
| 2006/0268594 A1 | 11/2006 | Toda |
| 2006/0273298 A1 | 12/2006 | Petti |
| 2007/0010100 A1 | 1/2007 | Raghuram et al. |
| 2007/0072360 A1 | 3/2007 | Kumar et al. |
| 2007/0114508 A1 | 5/2007 | Herner et al. |
| 2007/0114509 A1 | 5/2007 | Herner |
| 2007/0190722 A1 | 8/2007 | Herner |
| 2007/0228354 A1* | 10/2007 | Scheuerlein ................... 257/3 |
| 2007/0228414 A1 | 10/2007 | Kumar |
| 2007/0236981 A1 | 10/2007 | Herner |
| 2007/0246743 A1 | 10/2007 | Cho et al. |
| 2008/0175032 A1 | 7/2008 | Tanaka et al. |
| 2009/0001343 A1 | 1/2009 | Schricker et al. |
| 2009/0001344 A1 | 1/2009 | Schricker et al. |
| 2009/0001345 A1 | 1/2009 | Schricker et al. |
| 2009/0104756 A1 | 4/2009 | Kumar |
| 2009/0236581 A1* | 9/2009 | Yoshida et al. ................. 257/2 |

FOREIGN PATENT DOCUMENTS

| | | |
|---|---|---|
| EP | 1 484 799 A2 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| WO | WO 97/41606 | 11/1997 |
| WO | WO 00/49659 A1 | 8/2000 |
| WO | WO 01/69655 A2 | 9/2001 |
| WO | WO 03/079463 A2 | 9/2003 |
| WO | WO 2004/084229 A1 | 9/2004 |
| WO | WO 2005/008783 A1 | 1/2005 |
| WO | WO 2005/024839 A1 | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 A1 | 1/2007 |
| WO | WO 2007/018026 A1 | 2/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 A1 | 8/2008 |

OTHER PUBLICATIONS

Hiatt et al., "Bistable Switching In Niobium Oxide Diodes", Mar. 15, 1965, Applied Physics Letters, AIP, American Institute of Physics, Melville, NY, US, vol. 6, No. 6, pp. 106-108.

Hwang et al., "Molecular Dynamics Simulations Of Nanomemory Element Based on Boron-Nitride Nanotube-To-Peapod Transition", Apr. 2005, Computational Materials Science, Elsevier, Amsterdam, NL, vol. 33, No. 1-3, pp. 317-324.

Prince, B, "Trends in Scaled and Nanotechnology Memories", Sep. 2005, Non-Volatile Memory Technology Symposium, IEEE, Piscataway, NJ, USA, pp. 55-61.

Mine, Lili, "ReRAM with Erase/Reed Speed of 3 ns, Applicable as Multi-level Cell", Dec. 26, 2006, Nikkei Electronics, <http://techon.nikkeibp.co.jp/english/NEWS_EN/20061226/125918/>; pp. 1-2.

Seo et al., "Conductivity Switching Characteristics and Reset Currents in NiO Films", Applied Physics Letters, 86, 093509 (2005), pp. 1-3.

Roginskaya et al., "Characterization of Bulk and Surface Composition of $Co_xNi_{1-x}O_y$ Mixed Oxides for Electrocatalysis", 1997, Langmuir, vol. 13, No. 17, pp. 4621-4627.

Bruyere et al., Switching and Negative Resistance in Thin Films of Nickel Oxide, Jan. 1, 1970, Applied Physics Letters, vol. 16, No. 1, pp. 40-43.

Baek et al., "Highly Scalable Non-volatile Resistive Memory using Simple Binary Oxide Driven by Asymmetric Unipolar Voltage Pulses", IEDM, (Jan. 2004), pp. 587-590.

Pagnia et al., "Bistable Switching in Electroformed Metal-Insulator-Metal Devices", Phys. Stat. Sol. A 108, 11 (1988), pp. 10-65.

Park et al., "Reproducible Resistive Switching in Nonstoichiometric Nickel Oxide films Grown by RF Reactive Sputtering for Resistive Random Access Memory Applications", J. Vac. Sci. Technol. A 23(5), (Sep./Oct. 2005), pp. 1309-1313.

Seo et al., "Reproducible Resistance Switching in Polycrystalline NiO Films", Appl. Phys. Lett. vol. 85, No. 23, (Dec. 6, 2004), pp. 5655-5657.

Sim et al., "Resistance-Switching Characteristics of Polycrystalline Nb2O5 for Nonvolatile Memory Application", IEEE Electron Device Letters 26, 292, (2005), pp. 1-3.

Fuschillo et al., "Non-Linear Transport and Switching Properties of Transition Metal Oxides", Proc. 6th Internl. Vacuum Congr. 1974, Japan. J. Appl. Phys. Suppl. 2, pt. 1, 1974, pp. 817-820.

Beck et al., "Reproducible Switching Effect in Thin Oxide Films for Memory Applications", Jul. 3, 2000, Applied Physics Letters, vol. 77, No. 1, pp. 139-141.

Windisch et al., "Synthesis and Characterization of Transparent Conducting Oxide Cobalt-Nicket Spinel Films", Jul./Aug. 2001, J. Vac. Sci. Technol. A 19(4), pp. 1647-1651.

Baek et al., "Multi-layer Cross-point Binary Oxide Resistive Memory (OxRRAM) for Post-NAND Storage Application," 2005, pp. 1-4, IEEE.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Nov. 21, 2008 International Search Report and Written Opinion of PCT/US2008/007985.

Mar. 19, 2009 Office Action of U.S. Appl. No. 11/772,088.

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Depositioni of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of The Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of The Electrochemical Society, 149 (11), pp. C573-C578.

Han et al., "The Growth Mechanism of Nickel Oxide Thin Films by Room-Temperature Chemical Bath Deposition", 2006, Journal of The Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of The Electrochemical Society, 146 (4), pp. 1407-1411.

Abouatallah et al., "Characterization of Vanadium Deposit Formation at a Hydrogen Evolving Electrode in Alkaline Media", 2001, Journal of the Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCI-KCl-K2TzF7 Melts", May 1992, J. Electrochem. Soc., vol. 139, No. 5, pp. 1249-1255.

Herner et. al., "Vertical p-i-n Polysilicon Diode With Antifuse for Stackable Field-Programmable ROM", May 2004, IEEE Electron Device Letters, vol. 25, No. 5, pp. 271-273.

Jun. 18, 2009 Reply to Mar. 19, 2009 Office Action of U.S. Appl. No. 11/772,088.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Final Office Action of U.S. Appl. No. 11/772,088 mailed Oct. 6, 2009.

Office Action of related U.S. Appl. No. 11/772,088 mailed Jan. 22, 2010.

Jan. 6, 2010 Reply to Final Office Action of related U.S. Appl. No. 11/772,088 mailed Oct. 6, 2009.

Apr. 21, 2010 Reply to Jan. 22, 2010 Office Action of U.S. Appl. No. 11/772,088.

Office Action of European Patent Application No. 08 768 806.5 mailed Jun. 23, 2010.

Final Office Action of U.S. Appl. No. 11/772,088 mailed Aug. 20, 2010.

Examiner's Interview Summary of U.S. Appl. No. 11/772,088 mailed Aug. 31, 2010.

Sep. 13, 2010 Reply to Aug. 20, 2010 Final Office Action of related U.S. Appl. No. 11/772,088.

* cited by examiner

MEMORY CELL THAT EMPLOYS A SELECTIVELY GROWN REVERSIBLE RESISTANCE-SWITCHING ELEMENT AND METHODS OF FORMING THE SAME

CROSS REFERENCE TO RELATED APPLICATIONS

The present application is related to the following patent applications, each of which is hereby incorporated by reference herein in its entirety for all purposes:

U.S. patent application Ser. No. 11/772,084, filed on even date herewith and titled "METHOD TO FORM A REWRITEABLE MEMORY CELL COMPRISING A DIODE AND A RESISTIVITY-SWITCHING GROWN OXIDE".

U.S. patent application Ser. No. 11/772,088, filed on even date herewith and titled "MEMORY CELL THAT EMPLOYS A SELECTIVELY DEPOSITED REVERSIBLE RESISTANCE-SWITCHING ELEMENT AND METHODS OF FORMING THE SAME".

U.S. patent application Ser. No. 11/772,090, filed on even date herewith and titled "MEMORY CELL THAT EMPLOYS A SELECTIVELY DEPOSITED REVERSIBLE RESISTANCE-SWITCHING ELEMENT AND METHODS OF FORMING THE SAME".

FIELD OF THE INVENTION

The present invention relates to non-volatile memories and more particularly to a memory cell that employs a selectively grown reversible resistance-switching element and methods of forming the same.

BACKGROUND OF THE INVENTION

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety for all purposes, describes a rewriteable non-volatile memory cell that includes a diode coupled in series with a reversible resistivity-switching material such as a metal oxide or metal nitride.

However, fabricating memory devices from rewriteable resistivity-switching materials is difficult; and improved methods of forming memory devices that employ reversible resistivity-switching materials are desirable.

SUMMARY OF THE INVENTION

In a first aspect of the invention, a method of forming a memory cell is provided that includes (1) forming a steering element above a substrate; and (2) forming a reversible resistance-switching element coupled to the steering element using a selective growth process.

In a second aspect of the invention, a method of forming a memory cell is provided that includes (1) forming a first conductor above a substrate; (2) forming a reversible resistance-switching element above the first conductor using a selective growth process; (3) forming a diode above the first conductor; and (4) forming a second conductor above the diode and the reversible resistance-switching element.

In a third aspect of the invention, a method of forming a memory cell is provided that includes (1) forming a first conductor above a substrate; (2) forming a titanium nitride layer above the first conductor; (3) selectively forming a reversible resistance-switching element by oxidizing the titanium nitride layer; (4) forming a vertical polycrystalline diode above the reversible resistance-switching element; and (5) forming a second conductor above the vertical polycrystalline diode.

In a fourth aspect of the invention, a method of forming a memory cell is provided that includes (1) forming a thin film transistor having a source region and a drain region; (2) forming a first conductor coupled to the source region or the drain region of the transistor; (3) forming a titanium nitride layer above the first conductor; (4) selectively forming a reversible resistance-switching element by oxidizing the titanium nitride layer; and (5) forming a second conductor above the reversible resistance-switching element.

In a fifth aspect of the invention, a memory cell is provided that includes (1) a steering element; and (2) a reversible resistance-switching element coupled to the steering element and formed using a selective growth process.

In a sixth aspect of the invention, a memory cell is provided that includes (1) a first conductor; (2) a second conductor formed above the first conductor; (3) a diode formed between the first and second conductors; and (4) a reversible resistance-switching element formed between the first and second conductors using a selective growth process.

In a seventh aspect of the invention, a memory cell is provided that includes (1) a first conductor; (2) a titanium nitride layer formed above the first conductor; (3) a reversible resistance-switching element selectively formed by oxidizing the titanium nitride layer; (4) a vertical polycrystalline diode formed above the reversible resistance-switching element; and (5) a second conductor formed above the vertical polycrystalline diode.

In an eighth aspect of the invention, a memory cell is provided that includes (1) a thin film transistor having a source region and a drain region; (2) a first conductor coupled to the source region or the drain region; (3) a titanium nitride layer formed above the first conductor; (4) a reversible resistance-switching element selectively formed by oxidizing the titanium nitride layer; and (5) a second conductor formed above the reversible resistance-switching element.

In a ninth aspect of the invention, a plurality of non-volatile memory cells are provided that include (1) a first plurality of substantially parallel, substantially coplanar conductors extending in a first direction; (2) a plurality of diodes; (3) a plurality of reversible resistance-switching elements; and (4) a second plurality of substantially parallel, substantially coplanar conductors extending in a second direction different from the first direction. In each memory cell, one of the diodes and one of the reversible resistance-switching elements are arranged in series, disposed between one of the first conductors and one of the second conductors. Each reversible resistance-switching element is formed using a selective growth process.

In a tenth aspect of the invention, a monolithic three dimensional memory array is provided that includes a first memory level formed above a substrate and having a plurality of memory cells. Each memory cell of the first memory level includes (1) a steering element; and (2) a reversible resistance-switching element coupled to the steering element and formed using a selective growth process. The monolithic three dimensional memory array also includes at least a second memory level monolithically formed above the first memory level. Numerous other aspects are provided.

Other features and aspects of the present invention will become more fully apparent from the following detailed description, the appended claims and the accompanying drawings.

DETAILED DESCRIPTION

As stated above, fabricating memory devices from rewriteable resistivity-switching materials is difficult. For example, many rewriteable resistivity-switching materials are difficult to etch chemically, increasing fabrication costs and complexity associated with their use in integrated circuits.

In accordance with the present invention, difficult-to-etch-chemically rewriteable resistivity-switching materials may be used within a memory cell without being etched. For example, in at least one embodiment, a memory cell is provided that includes a reversible resistivity-switching material formed using a selective growth process so that the reversible resistivity-switching material may be used within the memory cell without being etched.

In one or more exemplary embodiments, a reversible resistance-switching element may be formed using titanium oxide as a reversible resistivity-switching material. Titanium oxide films have been shown to be suitable for use in memory cells, as described, for example, in the '939 Application, previously incorporated.

Titanium oxide films such as TiO, $TiO_2$, $TiO_x$, $TiO_xN_y$, etc., are difficult to etch chemically. In at least one embodiment, through use of a selective growth process, a titanium oxide layer may be used in a reversible resistance-switching element of a memory cell without the titanium oxide layer being etched. For example, a reversible resistance-switching element may be formed by oxidizing a titanium-containing layer, such as titanium nitride, that is easier to pattern and etch than titanium oxide. In this manner, only the underlying titanium-containing layer (e.g., titanium nitride or titanium) is patterned and/or etched prior to oxidation of the titanium-containing layer and not the titanium oxide layer.

In some embodiments, titanium oxide may be selectively formed by rapid thermal oxidation of a titanium-containing layer in an oxygen environment such as $O_2$, ozone, a combination of the same, or using any other suitable oxidizing species. In other embodiments, titanium oxide may be formed by oxidizing a titanium-containing layer using oxygen diffusion in a chemical vapor deposition (CVD) chamber with an ozone or other oxygen source, using gaseous or liquid ozone cleaning, or using any other suitable oxidation process. In any case, the need for etching of titanium oxide layers may be eliminated and memory cell fabrication significantly simplified.

Other materials may be selectively oxidized in accordance with the present invention to form reversible or one-time-programmable resistivity-switching materials for use in memory cells. For example, a layer of Ta, TaN, Nb, NbN, Al, AlN, Hf, HfN, V, VN, etc., may be deposited on a substrate, patterned, etched and/or oxidized similarly to a titanium-containing layer so as to form a reversible resistivity-switching material such as $Ta_2O_5$, $Nb_2O_5$, $Al_2O_3$, $HfO_2$, $V_2O_5$, etc.

Exemplary Inventive Memory Cell

Figure 1:
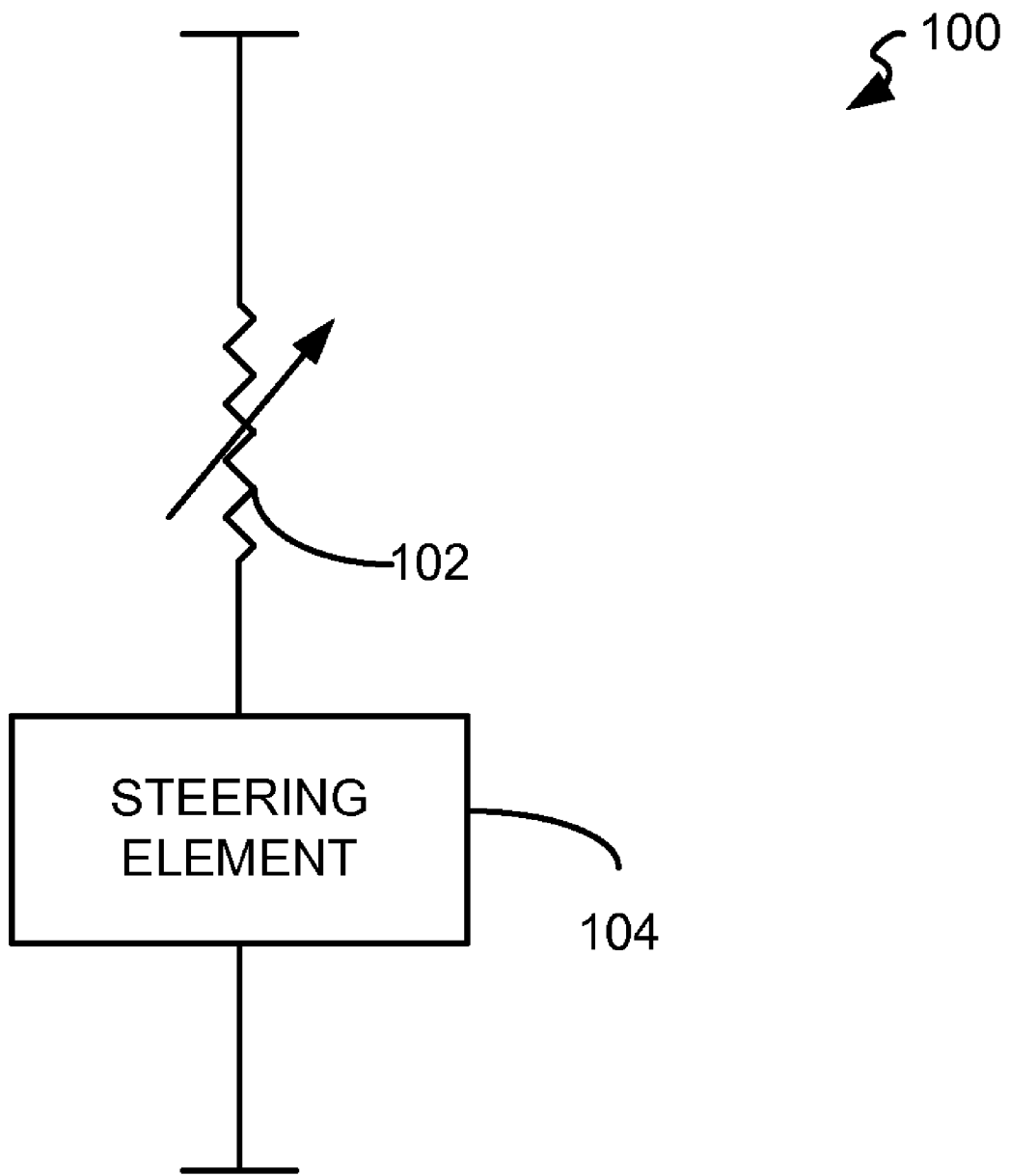
FIG. 1 is a schematic illustration of an exemplary memory cell provided in accordance with the present invention.

FIG. 1 is a schematic illustration of an exemplary memory cell 100 provided in accordance with the present invention. The memory cell 100 includes a reversible resistance-switching element 102 coupled to a steering element 104.

The reversible resistance-switching element 102 includes a reversible resistivity-switching material (not separately shown) having a resistance that may be reversibly switched between two or more states. For example, the reversible resistivity-switching material of the element 102 may be in an initial, low-resistivity state upon fabrication that is switchable to a high-resistivity state upon application of a first voltage and/or current. Application of a second voltage and/or current may return the reversible resistivity-switching material to a low-resistivity state. Alternatively, the reversible resistance-switching element 102 may be in an initial, high-resistance state upon fabrication that is reversibly switchable to a low-resistance state upon application of the appropriate voltage(s) and/or current(s). When used in a memory cell, one resistance state may represent a binary "0" while another resistance state may represent a binary "1", although more than two data/resistance states may be used. Numerous reversible resistivity-switching materials and operation of memory cells employing reversible resistance-switching elements are described, for example, in the '939 Application, previously incorporated.

In at least one embodiment of the invention, the reversible resistance-switching element 102 is formed using a selective growth process. As will be described further below, use of a selective growth process allows a reversible resistivity-switching material to be provided within the reversible resistance-switching element 102 without the reversible resistivity-switching material having to be etched. Fabrication of the reversible resistance-switching element 102 thereby is simplified.

The steering element 104 may include a thin film transistor, a diode, or another suitable steering element that exhibits non-ohmic conduction by selectively limiting the voltage across and/or the current flow through the reversible resistance-switching element 102. In this manner, the memory cell 100 may be used as part of a two or three dimensional memory array and data may be written to and/or read from the memory cell 100 without affecting the state of other memory cells in the array.

Exemplary embodiments of the memory cell 100, the reversible resistance-switching element 102 and the steering element 104 are described below with reference to FIGS. 2A-5.

First Exemplary Embodiment of a Memory Cell

Figure 2A:
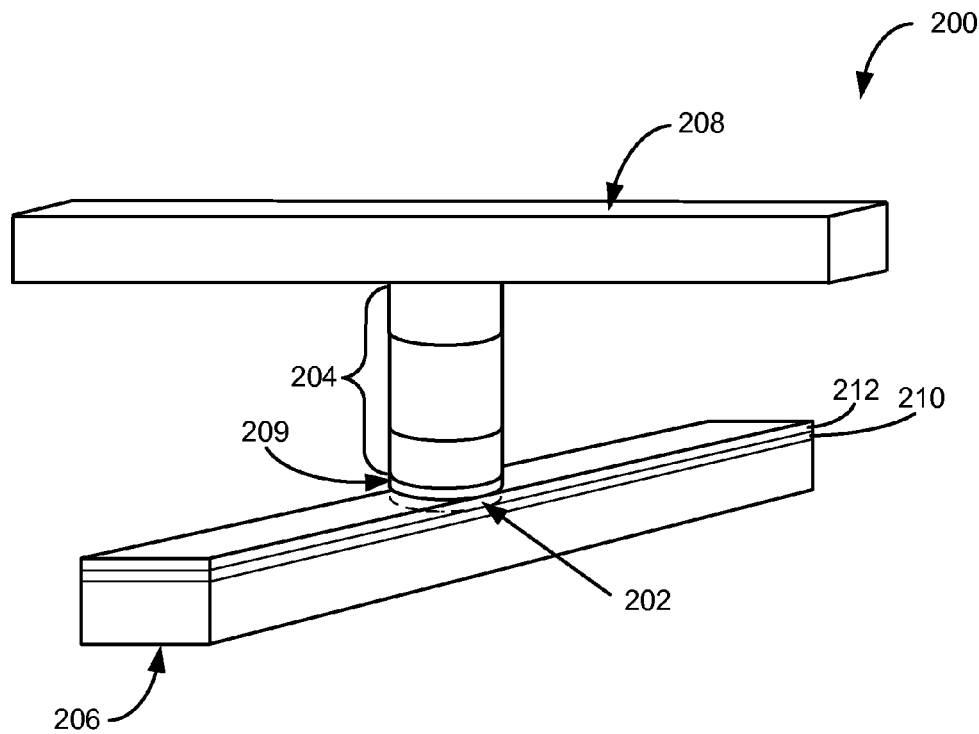
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, the memory cell 200 includes a reversible resistance-switching element 202 (shown in phantom) coupled in series with a diode 204 between a first conductor 206 and a second conductor 208. In some embodiments, a barrier layer 209 such as titanium nitride, tantalum nitride, tungsten nitride, etc., may be provided between the reversible resistance-switching element 202 and the diode 204.

As will be described further below, the reversible resistance-switching element 202 is selectively formed so as to simplify fabrication of the memory cell 200. In at least one embodiment, the reversible resistance-switching element 202 includes at least a portion of a titanium oxide layer formed by oxidizing a titanium-containing layer such as titanium nitride. For example, a titanium nitride layer or another similar form of titanium may be deposited above or below the diode 204, patterned and etched (e.g., such as with the first conductor 206). The titanium nitride (or other) layer then may be oxidized to form titanium oxide (e.g., using rapid thermal oxidation or another oxidation process).

In the embodiment of FIG. 2A, a titanium nitride or similar layer 210 is formed over, and is patterned and etched with, the first conductor 206. The titanium nitride or similar layer 210 then is oxidized to form a titanium oxide layer 212. A portion of the titanium oxide layer 212 that vertically overlaps and/or aligns with the diode 204 may serve as the reversible resistance-switching element 202 between the diode 204 and the first conductor 206 of the memory cell 200. In some embodiments, only a portion, such as one or more filaments, of the reversible resistance-switching element 202 may switch and/or be switchable. The titanium oxide layer 212 may include, for example, TiO, $TiO_2$, $TiO_x$, $TiO_xN_y$, or the like. While the reversible resistance-switching element 202 is shown as being positioned below the diode 204 in FIG. 2A, it will be understood that in alternative embodiments, the reversible resistance-switching element 202 may be positioned above the diode 204. Additional details for the reversible resistance-switching element 202 are described below with reference to FIG. 3.

The diode 204 may include any suitable diode such as a vertical polycrystalline p-n or p-i-n diode, whether upward pointing with an n-region above a p-region of the diode or downward pointing with a p-region above an n-region of the diode. Exemplary embodiments of the diode 204 are described below with reference to FIG. 3.

The first and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, the first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first and/or second conductors 206, 208 to improve device performance and/or aid in device fabrication.

As stated, other materials may be used to form the reversible resistance-switching element 202. For example, materials such as Ta, TaN, Nb, NbN, Al, AlN, Hf, HfN, V, VN, etc., may be similarly deposited over (and/or patterned and etched with) the first conductor 206 and then oxidized to form the layer 212, which includes the reversible resistance-switching element 202.

Figure 2B:
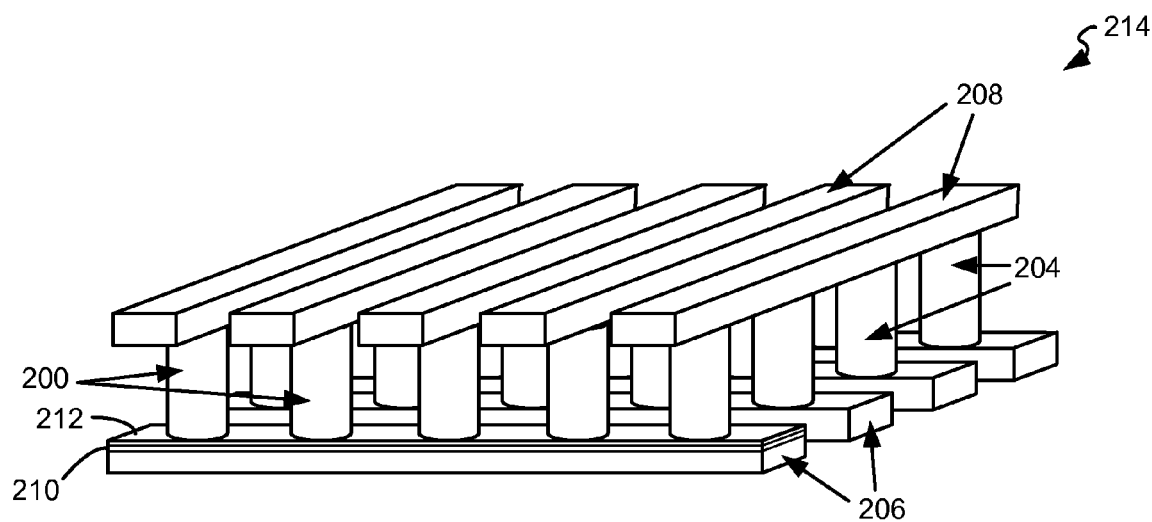
FIG. 2B is a simplified perspective view of a portion of a first memory level formed from a plurality of the memory cells of FIG. 2A.
Figure 2C:
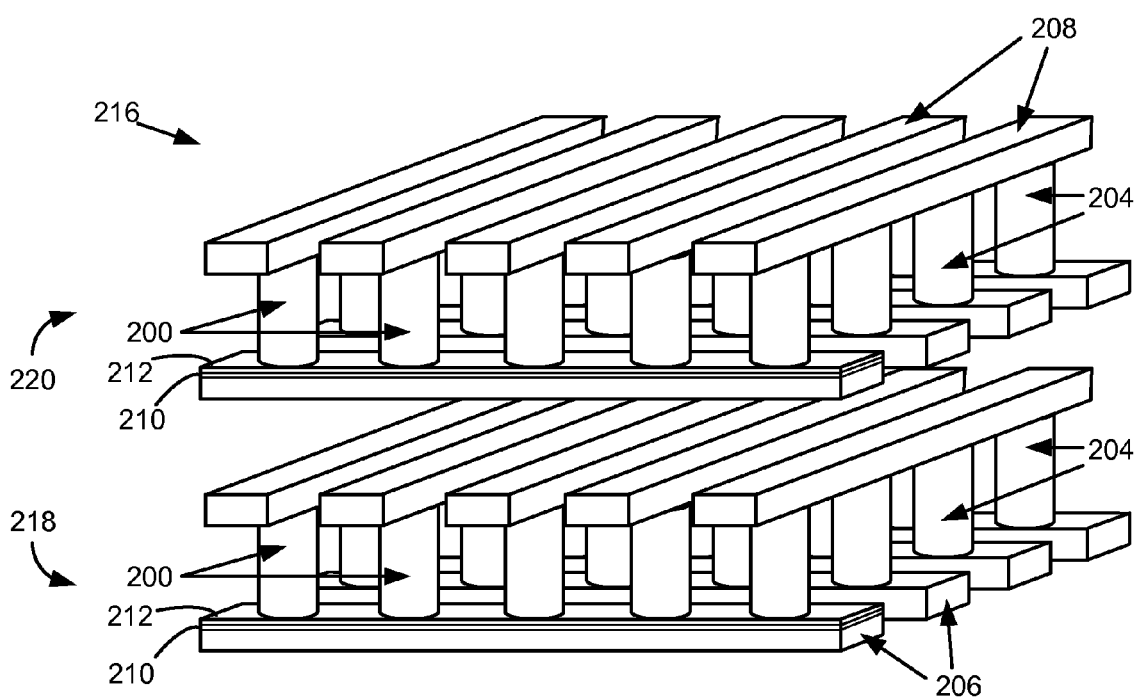
FIG. 2C is a simplified perspective view of a portion of a first exemplary three dimensional memory array provided in accordance with the present invention.

FIG. 2B is a simplified perspective view of a portion of a first memory level 214 formed from a plurality of the memory cells 200 of FIG. 2A. For simplicity, the titanium-containing layer 210 and the titanium oxide layer 212 are only shown on one of the bottom conductors 206. The memory array 214 is a "cross-point" array including a plurality of bit lines (second conductors 208) and word lines (first conductors 206) to which multiple memory cells are coupled (as shown). Other memory array configurations may be used, as may multiple levels of memory. For example, FIG. 2C is a simplified perspective view of a portion of a monolithic three dimensional array 216 that includes a first memory level 218 positioned below a second memory level 220. In the embodiment of FIG. 2C, each memory level 218, 220 includes a plurality of memory cells 200 in a cross-point array. It will be understood that one or more additional layers (e.g., an interlevel dielectric) may be present between the first and second memory levels 218 and 220, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diode are employed, simplifying diode fabrication.

Figure 2D:
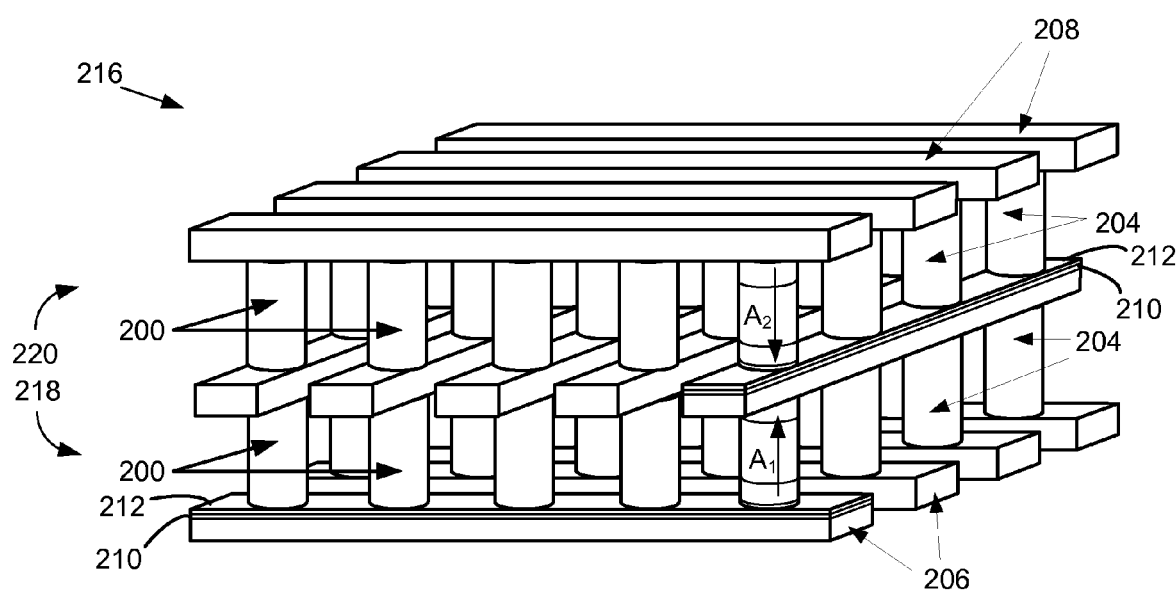
FIG. 2D is a simplified perspective view of a portion of a second exemplary three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692, 151, filed Mar. 27, 2007 and titled "LARGE ARRAY OF UPWARD POINTING P-I-N DIODES HAVING LARGE AND UNIFORM CURRENT" (hereinafter "the '151 Application"), which is hereby incorporated by reference herein in its entirety for all purposes. For example, the diodes of the first memory level 218 may be upward pointing diodes as indicated by arrow A1 (e.g., with p regions at the bottom of the diodes), while the diodes of the second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3:
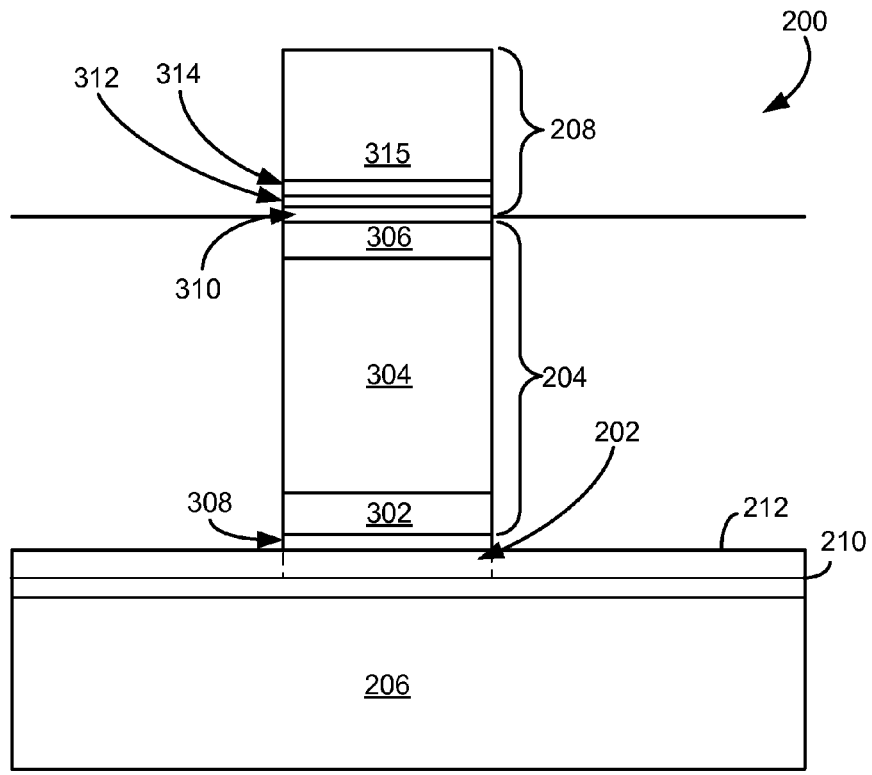
FIG. 3 is a cross-sectional view of an exemplary embodiment of the memory cell of FIG. 2A.

FIG. 3 is a cross-sectional view of an exemplary embodiment of the memory cell 200 of FIG. 2A. With reference to FIG. 3, the memory cell 200 includes the reversible resistance-switching element 202 (e.g., a portion of a layer of reversible resistivity-switching material, namely titanium oxide layer 212 in this embodiment), the diode 204 and the first and second conductors 206, 208. The reversible resistance-switching element 202 may be a portion of the titanium oxide layer 212 that vertically overlies and/or overlaps with the diode 204.

In the embodiment of FIG. 3, the reversible resistance-switching element 202 is formed by a selective growth process. For example, the titanium oxide layer 212 may be selectively formed on the titanium-containing layer 210 by oxidizing the titanium-containing layer 210. In this manner, only the titanium-containing layer 210, and not the titanium oxide layer 212, is etched, such as during the pattern and etch step(s) for the first conductor 206.

The titanium-containing layer 210 may be oxidized by any suitable process. For instance, the titanium-containing layer 210 may be oxidized using thermal oxidation in oxygen, ozone, a combination of the same or another oxygen source (e.g., using rapid thermal oxidation). Alternatively or additionally, the titanium-containing layer 210 may be oxidized using oxygen diffusion in a CVD chamber with an ozone or other oxygen source, using gaseous or liquid ozone cleaning, or using any other suitable oxidation process to form titanium oxide. As stated, other reversible resistance-switching materials may be similarly formed by oxidizing Ta, TaN, Nb, NbN, Al, AlN, Hf, HfN, V, VN, etc.

In one exemplary embodiment, rapid thermal oxidation may be performed at a temperature of about 300° C. to about 800° C. for about one second to about 5 minutes at an oxygen flow rate of about 2 sccm to about 40 sccm, depending on the desired oxide thickness and/or other properties. Other oxidizing species, temperatures, times and/or flow rates may be used.

Oxidation by ozone diffusion in a CVD chamber may be performed at a temperature of about 300° C. to about 800° C., more preferably at a temperature of about 350° C. to about 450° C., for about 2 minutes to about 4 hours, more preferably for about 15 to 25 minutes, at a suitable ozone flow rate, such as between about 10 and 60 sccm, depending on the desired oxide thickness and/or other properties. Other oxidizing species, temperatures, times and/or flow rates may be used.

In each of the above cases, only the titanium-containing layer 210 is patterned and etched, and the need for etching of titanium oxide layers is eliminated. Memory cell fabrication is thereby significantly simplified. Further, any desired thickness of titanium oxide may be formed. In some embodiments, a titanium oxide layer thickness of about 500 angstroms or less, and more preferably about 300 angstroms or less, is employed for the reversible resistance-switching element 202 (although other thickness ranges may be used).

As stated, the diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, the diode 204 may be formed from a polycrystalline semiconductor material such as polysilicon, a polycrystalline silicon-germanium alloy, polygermanium or any other suitable material. For example, the diode 204 may include a heavily doped n+ polysilicon region 302, a lightly doped or an intrinsic (unintentionally doped) polysilicon region 304 above the n+ polysilicon region 302 and a heavily doped, p+ polysilicon region 306 above the intrinsic region 304. In some embodiments, a thin (e.g., a few hundred angstroms or less) germanium and/or silicon-germanium alloy layer (not shown), with about 10 at % or more of germanium when using a silicon-germanium alloy layer, may be formed on the n+ polysilicon region 302 to prevent and/or reduce dopant migration from the n+ polysilicon region 302 into the intrinsic region 304, as described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 Application"), which is hereby incorporated by reference herein in its entirety for all purposes. It will be understood that the locations of the n+ and p+ regions may be reversed.

In some embodiments, a barrier layer 308 such as titanium nitride, tantalum nitride, tungsten nitride, etc., may be formed between the titanium oxide layer 212 and the n+ region 302 (e.g., to prevent and/or reduce migration of metal atoms into the polysilicon regions). Use of such a metal barrier layer may form an unwanted rectifying contact between the barrier layer 308 and the titanium oxide layer 212. Accordingly, in some embodiments, a thin conductive layer (not shown), such as titanium, nickel, other conductive materials, etc., may be formed between the titanium oxide layer 212 and the barrier layer 308 (e.g., for work function tuning, to reduce or prevent formation of a rectifying contact).

When the diode 204 is formed from deposited silicon (e.g., amorphous or polycrystalline), a silicide layer 310 may be formed on the diode 204 to place the deposited silicon in a low resistivity state, as fabricated. Such a low resistivity state allows for easier programming of the memory cell 200 as a large voltage is not required to switch the deposited silicon to a low resistivity state. For example, a silicide-forming metal layer 312 such as titanium or cobalt, may be deposited on the p+ polysilicon region 306. During a subsequent anneal step (described below) employed to crystallize the deposited silicon that forms the diode 204, the silicide-forming metal layer 312 and the deposited silicon of the diode 204 interact to form the silicide layer 310, consuming all or a portion of the silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer 310 enhances the crystalline structure of the silicon diode 204 during annealing). Lower resistivity silicon thereby is provided. Similar results may be achieved for silicon-germanium alloy and/or germanium diodes.

Following formation of the silicide-forming metal layer 312, the top conductor 208 is formed. In some embodiments, one or more barrier layers and/or adhesion layers 314 may be formed over the silicide-forming metal layer 312 prior to deposition of a conductive layer 315. The conductive layer 315, barrier layer 314 and silicide-forming metal layer 312 may be patterned and/or etched together to form the top conductor 208.

Following formation of the top conductor 208, the memory cell 200 may be annealed to crystallize the deposited semiconductor material of the diode 204 (and/or to form the silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, the silicide layer 310 may serve as a "crystallization template" or "seed" during annealing for underlying deposited semiconductor material that forms the diode 204. Lower resistivity diode material thereby is provided.

An exemplary process for fabricating a memory cell in accordance with the present invention is described below with reference to FIGS. 4A-D.

Exemplary Fabrication Process for a Memory Cell

FIGS. 4A-D illustrate cross sectional views of a portion of a substrate 400 during fabrication of a first memory level in accordance with the present invention. As will be described below, the single memory level includes a plurality of memory cells that each include a reversible resistance-switching element formed using a selective growth process. Additional memory levels may be fabricated above the first memory level (as described previously with reference to FIGS. 2C-2D).

Figure 4A:
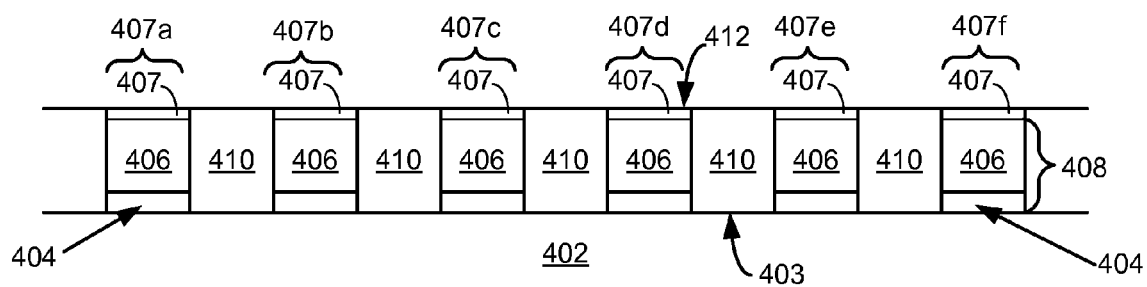
FIGS. 4A-D illustrate cross sectional views of a portion of a substrate during fabrication of a single memory level in accordance with the present invention.

With reference to FIG. 4A, the substrate 400 is shown as having already undergone several processing steps. The substrate 400 may be any suitable substrate such as a silicon, germanium, silicon-germanium, undoped, doped, bulk, silicon-on-insulator (SOI) or other substrate with or without additional circuitry. For example, the substrate 400 may include one or more n-well or p-well regions (not shown).

Isolation layer 402 is formed above the substrate 400. In some embodiments, the isolation layer 402 may be a layer of silicon dioxide, silicon nitride, silicon oxynitride or any other suitable insulating layer. In other embodiments, the isolation layer 402 may be a shallow trench isolation (STI) region formed by etching a trench in the substrate 400, depositing a dielectric such as silicon dioxide, silicon nitride or another dielectric over the substrate 400 to fill the trench and planarizing the substrate 400 to re-expose a top surface 403 of the substrate 400. Note that in one or more embodiments, a silicon nitride or similar protective layer (not shown) may be formed over active regions (not shown) of the substrate 400 prior to isolation region formation (e.g., to protect the active regions). As an alternative, a localized oxidation of silicon (LOCOS) process or any other suitable process may be employed to define the isolation layer 402.

Following formation of the isolation layer 402, an adhesion layer 404 is formed over the isolation layer 402 (e.g., by physical vapor deposition or another method). For example, the adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, the adhesion layer 404 may be optional.

After formation of the adhesion layer 404, a conductive layer 406 is deposited over the adhesion layer 404. The conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition, physical vapor deposition, etc.). In at least one embodiment, the conductive layer 406 may comprise about 200 to about 2500 angstroms of tungsten. Other conductive layer materials and/or thicknesses may be used.

After formation of the conductive layer 406, a titanium-containing layer 407, such as titanium nitride, is formed over the conductive layer 406 (e.g., using physical vapor deposition or another method). In some embodiments, the titanium-containing layer 407 includes about 20 to about 1200 angstroms of titanium nitride. Other titanium-containing layer materials, such as titanium, a titanium alloy, $TiSi_2$, TiW, etc., and/or thicknesses may be used.

Following formation of the titanium-containing layer 407, the adhesion layer 404, the conductive layer 406 and the titanium-containing layer 407 are patterned and etched. For example, the adhesion layer 404, the conductive layer 406 and the titanium-containing layer 407 may be patterned and etched using conventional lithography techniques, with a soft or hard mask, and wet or dry etch processing. In at least one embodiment, the adhesion layer 404, the conductive layer 406 and the titanium-containing layer 407 are patterned and etched so as to form substantially parallel, substantially coplanar conductors 408 (as shown in FIG. 4A). Exemplary widths for the conductors 408 and/or spacings between the conductors 408 range from about 200 to about 2500 angstroms, although other conductor widths and/or spacings may be used.

After the conductors 408 have been formed, a dielectric layer 410 is deposited over the substrate 400 so as to fill the voids between the conductors 408. For example, approximately 3000-7000 angstroms of silicon dioxide may be deposited on the substrate 400 and planarized using chemical mechanical polishing or an etchback process to form a planar surface 412. The planar surface 412 includes exposed, discrete regions 407a-f of titanium-containing layer material 407 separated by dielectric material 410, as shown. The discrete titanium-containing layer regions 407a-f may be used to selectively form a titanium oxide reversible resistance-switching element for each memory cell being formed above the substrate 400 (as described further below).

Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

If a reversible resistance-switching element is to be formed by oxidizing a material other than a titanium-containing material, the titanium-containing layer 407 may be replaced with a layer of the material to be oxidized, such as Ta, TaN, Nb, NbN, Al, AlN, Hf, HfN, V, VN, etc.

Figure 4B:
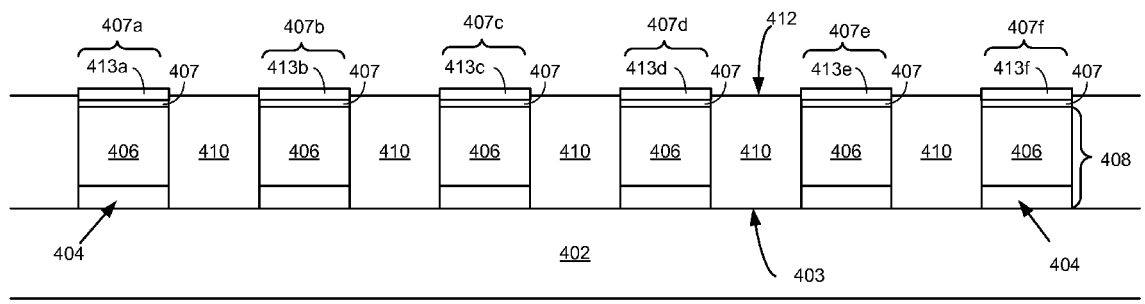

Referring to FIG. 4B, following planarization, a reversible resistance-switching element 413a-f is formed over each titanium-containing layer region 407a-f. For example, a titanium oxide layer may be selectively formed over each titanium-containing layer region 407a-f by oxidizing the titanium-containing layer regions 407a-f. Some or all of each titanium-containing layer region 407a-f may be consumed during oxidation to create reversible resistance-switching elements 413a-f. As described previously, any suitable method may be employed to oxidize the titanium-containing layer regions 407a-f such as rapid thermal oxidation in an oxygen environment such as $O_2$, ozone, a combination of the same, or using any other suitable oxidizing species. In other embodiments, a titanium-containing layer region may be oxidized using oxygen diffusion in a CVD chamber with an ozone or other oxygen source, using gaseous or liquid ozone cleaning, or using any other suitable oxidation process to form titanium oxide.

Figure 4C:
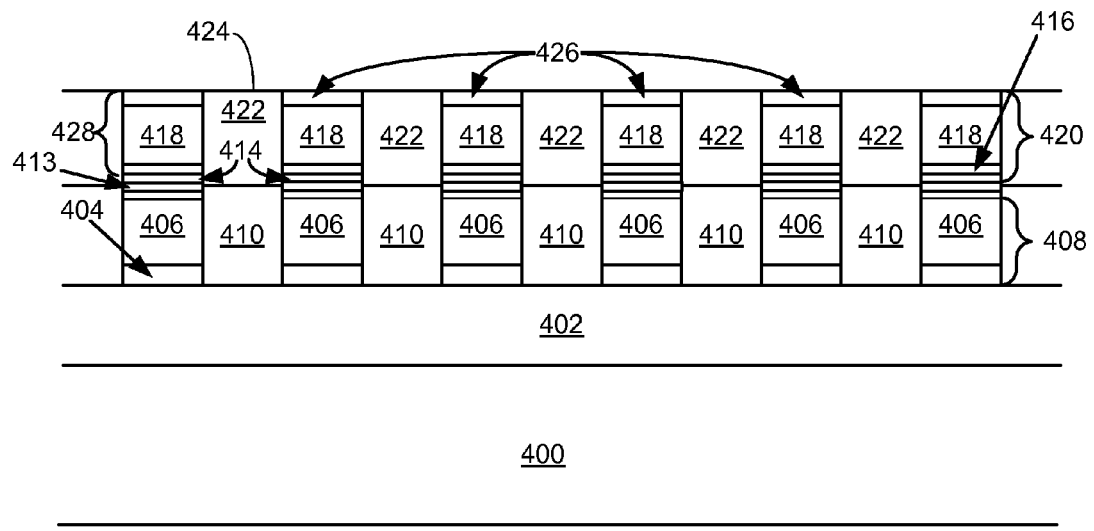

With reference to FIG. 4C, after the reversible resistance-switching elements 413a-f have been formed, the diode structures of each memory cell are formed. An optional thin conductive layer (not shown), such as about 10 to about 300 angstroms of titanium, nickel, etc., may be formed over the titanium oxide layer regions (e.g., for work function tuning). In some embodiments, a barrier layer 414, such as titanium nitride, tantalum nitride, tungsten nitride, etc., may also be formed over the titanium oxide layer regions prior to diode formation (e.g., to prevent and/or reduce migration of metal atoms into the polysilicon regions). The barrier layer 414 may be on top of, in addition to or in place of the thin conductive layer and may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of the thin conductive layer (if used) and/or the barrier layer 414, deposition of the semiconductor material used to form the diode of each memory cell begins (e.g., diode 204 in FIGS. 2A-3). Each diode may be a vertical p-n or p-i-n diode as previously described. In some embodiments, each diode is formed from a polycrystalline semiconductor material such as polysilicon, a polysilicon-germanium alloy, germanium or any other suitable material. For convenience, formation of a polysilicon, downward-pointing diode is described herein. It will be understood that other materials and/or diode configurations may be used.

With reference to FIG. 4C, following formation of the barrier layer 414, a heavily doped n+ silicon layer 416 is deposited on the barrier layer 414. In some embodiments, the n+ silicon layer 416 is in an amorphous state as deposited. In other embodiments, the n+ silicon layer 416 is in a polycrystalline state as deposited. Chemical vapor deposition or another suitable process may be employed to deposit the n+ silicon layer 416. In at least one embodiment, the n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, dopants and/or doping concentrations may be used. The n+ silicon layer 416 may be doped in situ, for example, by flowing a donor gas during deposition. Other doping methods may be used (e.g., implantation).

After deposition of the n+ silicon layer 416, a lightly doped, intrinsic and/or unintentionally doped silicon layer 418 is formed over the n+ silicon layer 416. In some embodiments, the intrinsic silicon layer 418 is in an amorphous state as deposited. In other embodiments, the intrinsic silicon layer 418 is in a polycrystalline state as deposited. Chemical vapor deposition or another suitable deposition method may be employed to deposit the intrinsic silicon layer 418. In at least one embodiment, the intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on the n+ silicon layer 416 prior to deposition of the intrinsic silicon layer 418 to prevent and/or reduce dopant migration from the n+ silicon layer 416 into the intrinsic silicon layer 418 (as described in the '331 Application, previously incorporated).

Following formation of the n+ silicon layer 416 and the intrinsic silicon layer 418, the n+ silicon layer 416, the intrinsic silicon layer 418, the barrier layer 414 and/or any conductive layer (if used) are patterned and etched so as to form silicon pillars 420 overlying the conductors 408 (as shown). Conventional lithography techniques, with a soft or hard mask, and wet or dry etch processing may be employed to form the silicon pillars 420.

After the silicon pillars 420 have been formed, a dielectric layer 422 is deposited to fill the voids between the silicon pillars 420. For example, approximately 200-7000 angstroms of silicon dioxide may be deposited and planarized using chemical mechanical polishing or an etchback process to form a planar surface 424. The planar surface 424 includes exposed top surfaces of the silicon pillars 420 separated by dielectric material 422, as shown. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

After formation of the silicon pillars 420, a p+ silicon region 426 is formed within each silicon pillar 420, near the upper surface of the silicon pillars 420. For example, a blanket p+ implant may be employed to implant boron a predetermined depth within the silicon pillars 420. Exemplary implantable molecular ions include $BF_2$, $BF_3$, B and the like. In some embodiments, an implant dose of about $1\text{-}5\times10^{15}$ ions/cm$^2$ may be employed. Other implant species and/or doses may be used. Further, in some embodiments, a diffusion process may be employed to dope the upper portion of the silicon pillars 420. In at least one embodiment, the p+ silicon regions 426 have a depth of about 100-700 angstroms, although other p+ silicon region sizes may be used. (Note that if the diodes to be formed are upward pointing p-n or p-i-n diodes, the upper portion of the silicon pillars 420 will be doped n-type). Each silicon pillar 420 thereby includes a downward-pointing, p-i-n diode 428.

Figure 4D:
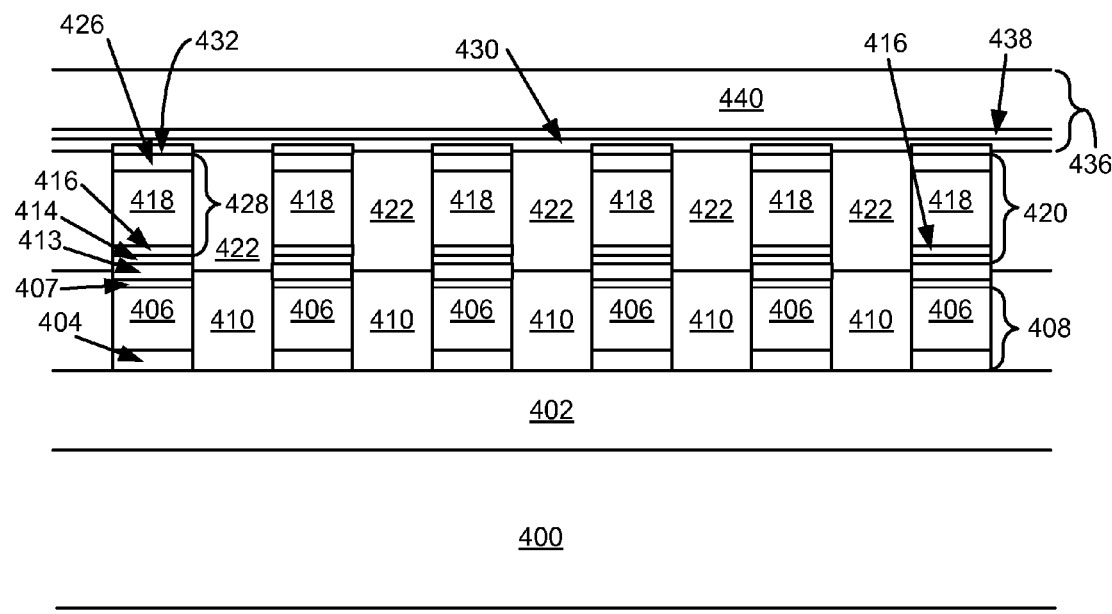

With reference to FIG. 4D, after completion of the p-i-n diodes 428, a silicide-forming metal layer 430 is deposited over the substrate 400. Exemplary silicide-forming metals include sputter or otherwise deposited titanium or cobalt. In some embodiments, the silicide-forming metal layer 430 has a thickness of about 10 to about 200 angstroms, preferably about 20 to about 50 angstroms and more preferably about 20 angstroms. Other silicide-forming metal layer materials and/or thicknesses may be used. As will be described further below, annealing of the structure causes metal from the silicide-forming metal layer 430 and silicon from the p+ silicon regions 426 to react to form a silicide region 432 adjacent each p+ silicon region 426.

Following formation of the silicide-forming metal layer 430, a second set of conductors 436 may be formed above the diodes 428 in a manner similar to the formation of the bottom set of conductors 408. In some embodiments, one or more barrier layers and/or adhesion layers 438 may be placed over the silicide-forming metal layer 430 prior to deposition of a conductive layer 440 used to form the upper, second set of conductors 436.

The conductive layer 440 may be formed from any suitable conductive material such as tungsten, another suitable metal, heavily doped semiconductor material, a conductive silicide, a conductive silicide-germanide, a conductive germanide, or the like deposited by any suitable method (e.g., chemical vapor deposition, physical vapor deposition, etc.). Other conductive layer materials may be used. Barrier layers and/or adhesion layers 438 may include titanium nitride or another suitable layer such as tantalum nitride, tungsten nitride, combinations of one or more layers, or any other suitable material (s). The deposited conductive layer 440, barrier and/or adhesion layer 438, and/or silicide-forming metal layer 430 may be patterned and/or etched to form the second set of conductors 436. In at least one embodiment, the upper conductors 436 are substantially parallel, substantially coplanar conductors that extend in a different direction than the lower conductors 408.

Following formation of the upper conductors 436, the structure may be annealed to crystallize the deposited semiconductor material of the diodes 428 (and/or to form the silicide regions 432). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions 432 may serve as "crystallization templates" or "seeds" during annealing for underlying deposited semiconductor material that forms the diodes 432 (e.g., changing any amorphous semiconductor material to polycrystalline semiconductor material and/or improving overall crystalline properties of the diodes 432). Lower resistivity diode material thereby is provided.

Alternative Exemplary Memory Cell

Figure 5:
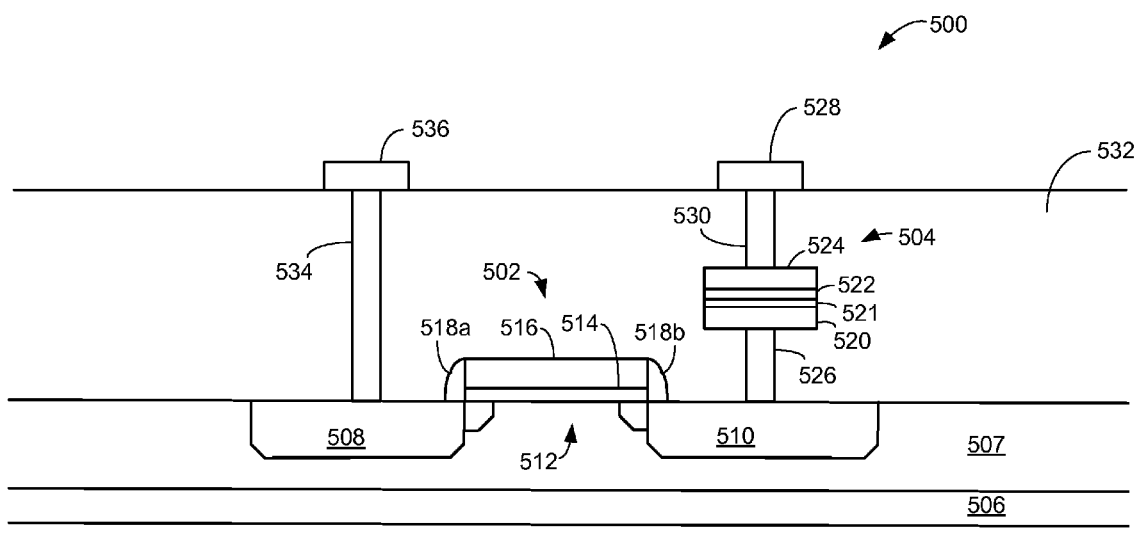
FIG. 5 is a cross sectional view of an alternative memory cell provided in accordance with the present invention.

FIG. 5 is a cross sectional view of an exemplary memory cell 500 provided in accordance with the present invention. The memory cell 500 includes a thin film transistor (TFT), such as a thin film, metal oxide semiconductor field effect transistor (MOSFET) 502 coupled to a reversible resistance-switching element 504 formed above a substrate 505. For example, the MOSFET 502 may be an n-channel or a p-channel thin film MOSFET formed on any suitable substrate. In the embodiment shown, an insulating region 506 such as silicon dioxide, silicon nitride, oxynitride, etc., is formed above the substrate 505 and a deposited semiconductor region 507 such as deposited silicon, germanium, silicon-germanium, etc., is formed above the insulating region 506. The thin film MOSFET 502 is formed within the deposited semiconductor region 507 and is insulated from the substrate 505 by the insulating region 506.

The MOSFET 502 includes source/drain regions 508, 510 and channel region 512, as well as gate dielectric layer 514, gate electrode 516 and spacers 518a-b. In at least one embodiment, the source/drain regions 508, 510 may be doped p-type and the channel region 512 may be doped n-type, while in other embodiments the source/drain regions 508, 510 may be doped n-type and the channel region 512 may be doped p-type. Any other MOSFET configuration or any suitable fabrication techniques may be employed for the thin film MOSFET 502. In some embodiments, the MOSFET 502 may be electrically isolated by isolation regions (not shown) formed in the substrate 506 (e.g., formed using an STI, LOCOS or other similar process). Alternatively, gate, source and/or drain regions of the MOSFET 502 may be shared with other transistors (not shown) formed on the substrate 506.

The reversible resistance-switching element 504 includes a lower conductor 520, a titanium-containing layer 521 formed over the lower conductor 520, a titanium oxide layer 522 selectively grown over the titanium-containing layer 521 and an upper conductor 524 formed over the reversible resistivity-switching material (titanium oxide layer 522). The upper and lower conductors 520, 524 may include any suitable conductive material such as tungsten, another metal, heavily doped semiconductor material, a conductive silicide, a conductive silicide-germanide, a conductive germanide, or the like. In some embodiments, one or more barrier and/or adhesion layers (not shown) may be provided between the upper and lower conductors 520, 524 and the reversible resistivity-switching material (titanium oxide layer 522).

In at least one embodiment, the reversible resistivity-switching material (titanium oxide layer 522) is formed using a selective growth process as previously described with reference to the embodiments of FIGS. 1-4D. For example, the titanium oxide layer 522 may be selectively formed by rapid thermal oxidation of the titanium-containing layer 521 in an oxygen environment such as $O_2$, ozone, a combination of the same, or using any other suitable oxidizing species. In other embodiments, the titanium oxide layer 522 may be formed by oxidizing the titanium-containing layer 521 using oxygen diffusion in a chemical vapor deposition (CVD) chamber with an ozone or other oxygen source, using gaseous or liquid ozone cleaning, or using any other suitable oxidation process. In any case, the need for etching of titanium oxide layers may be eliminated and memory cell fabrication significantly simplified. Other materials may be selectively oxidized in accordance with the present invention to form reversible resistivity-switching materials for use in memory cell 500 (e.g., Ta, TaN, Nb, NbN, Al, AlN, Hf, HfN, V, VN, etc.).

As shown in FIG. 5, the reversible resistance-switching element 504 is coupled to the source/drain region 510 of the MOSFET 502 by a first conductive plug 526 and to a first metal level (M1) line 528 by a second conductive plug 530 (which extend through a dielectric layer 532). Likewise, a third conductive plug 534 couples the source/drain region 508 of the MOSFET 502 to an M1 line 536. The conductive plugs and/or lines may be formed from any suitable materials (without or without barriers layers) such as tungsten, another metal, heavily doped semiconductor material, a conductive silicide, a conductive silicide-germanide, a conductive germanide, or the like. Note that when the MOSFET 502 is an n-channel device, the region 508 serves as the drain and the region 510 serves as the source for the MOSFET 502; and when the MOSFET 502 is an p-channel device, the region 508 serves as the source and the region 510 serves as the drain for the MOSFET 502. The dielectric layer 532 may include any suitable dielectric such as silicon dioxide, silicon nitride, silicon oxynitride, low K dielectrics, etc.

In the memory cell 500, the thin film MOSFET 502 operates as a steering element in a manner similar to that of the diodes employed in the memory cells of FIGS. 2A-4D, selectively limiting the voltage applied across and/or the current flow through the reversible resistance-switching element 504.

In at least one embodiment, the reversible resistance-switching element 504 includes a titanium oxide layer having a thickness of about 500 angstroms or less, and more preferably a thickness of about 300 angstroms or less. Other titanium oxide thicknesses may be employed.

The foregoing description discloses only exemplary embodiments of the invention. Modifications of the above disclosed apparatus and methods which fall within the scope of the invention will be readily apparent to those of ordinary skill in the art. For instance, although the present invention has been described primarily with regard to selective oxidation of titanium nitride, it will be understood that other materials may be selectively oxidized to form reversible resistivity-switching materials for use in memory cells such as Ta, TaN, Nb, NbN, Al, AlN, Hf, HfN, V, VN, etc.

Accordingly, while the present invention has been disclosed in connection with exemplary embodiments thereof, it should be understood that other embodiments may fall within the spirit and scope of the invention, as defined by the following claims.

The invention claimed is:

1. A method of forming a memory cell comprising:
   forming a steering element above a substrate; and
   forming a reversible resistance-switching element coupled to the steering element, wherein the reversible resistance-switching element is formed using a selective growth process comprising forming a Ti-nitride containing layer, etching the titanium nitride containing layer and oxidizing the etched Ti-nitride containing layer.

2. The method of claim 1 wherein forming the steering element comprises forming a diode.

3. The method of claim 1 wherein forming the steering element comprises forming a polycrystalline diode.

4. The method of claim 1 wherein forming the steering element comprises forming a vertical polycrystalline diode.

5. The method of claim 1 wherein forming the steering element comprises forming a vertical polycrystalline diode having polycrystalline material that is in a low-resistivity state.

6. The method of claim 1 wherein forming the steering element comprises forming a p-n diode or a p-i-n.

7. The method of claim 1 wherein forming the steering element comprises forming a thin film transistor.

8. The method of claim 1 wherein forming the steering element comprises forming a thin film, metal oxide semiconductor field effect transistor (MOSFET).

9. The method of claim 1 wherein forming the reversible resistance-switching element comprises forming at least one of TiO, $TiO_2$, $TiO_x$ and $TiO_xN_y$.

10. The method of claim 9 wherein forming the reversible resistance-switching element comprises forming a reversible resistance-switching element having an oxide thickness of about 500 angstroms or less.

11. The method of claim 10 wherein forming the reversible resistance-switching element comprises forming a reversible resistance-switching element having an oxide thickness of about 300 angstroms or less.

12. The method of claim 1 wherein the Ti-containing layer comprises a TiN layer.

13. The method of claim 1 further comprising coupling the steering element and reversible resistance-switching element in series.

14. A memory cell formed using the method of claim 1.

15. A memory cell formed using the method of claim 9.

16. A method of forming a memory cell comprising:
forming a first conductor above a substrate;
forming a reversible resistance-switching element above the first conductor, wherein the reversible resistance-switching element is formed using a selective growth process comprising forming a Ti-nitride containing layer, etching the Ti-nitride containing layer, and oxidizing the etched Ti-nitride containing layer;
forming a diode above the first conductor; and
forming a second conductor above the diode and the reversible resistance-switching element.

17. The method of claim 16 wherein forming the diode comprises forming a vertical polycrystalline diode.

18. The method of claim 17 further comprising forming a silicide, silicide-germanide or germanide region in contact with polycrystalline material of the vertical polycrystalline diode so that the polycrystalline material is in a low-resistivity state.

19. The method of claim 16 wherein forming the reversible resistance-switching element comprises selectively forming at least one of TiO, $TiO_2$, $TiO_x$ and $TiO_xN_y$.

20. The method of claim 16 wherein the Ti-containing layer comprises a TiN layer.

21. A memory cell formed using the method of claim 16.

22. A memory cell formed using the method of claim 19.

23. A method of forming a memory cell comprising:
forming a first conductor above a substrate;
forming a titanium nitride layer above the first conductor;
selectively forming a reversible resistance-switching element by etching the titanium nitride layer, and oxidizing the etched titanium nitride layer;
forming a vertical polycrystalline diode above the reversible resistance-switching element; and
forming a second conductor above the vertical polycrystalline diode.

24. The method of claim 23 further comprising forming a silicide, silicide-germanide or germanide region in contact with polycrystalline material of the vertical polycrystalline diode so that the polycrystalline material is in a low-resistivity state.

25. The method of claim 23 wherein forming the reversible resistance-switching element comprises selectively forming at least one of TiO, $TiO_2$, $TiO_x$ and $TiO_xN_y$.

26. The method of claim 23 wherein selectively forming the reversible resistance-switching element comprises forming a reversible resistance-switching element having an oxide thickness of about 300 angstroms or less.

27. The method of claim 23 wherein forming the vertical polycrystalline diode comprises forming a vertical polysilicon diode.

28. A memory cell formed using the method of claim 23.

29. The method of claim 1 wherein forming the reversible resistance-switching element comprises forming at least one of $Ta_2O_5$, $Nb_2O_5$, $Al_2O_3$, $HfO_2$, and $V_2O_5$.

30. A method of forming a memory cell, the method comprising:
forming a steering element above a substrate; and
forming a reversible resistance-switching element coupled to the steering element, wherein the reversible resistance-switching element comprises an etched and oxidized Ti-nitride material.

* * * * *